(12) United States Patent
Hsieh

(10) Patent No.: US 6,184,082 B1
(45) Date of Patent: Feb. 6, 2001

(54) METHOD OF FABRICATING DYNAMIC RANDOM ACCESS MEMORY

(75) Inventor: Yong-Fen Hsieh, Hsinchu Hsien (TW)

(73) Assignee: United Microelectronics Corp., United Semiconductor Corp., Hsinchu (TW)

( * ) Notice: Under 35 U.S.C. 154(b), the term of this patent shall be extended for 0 days.

(21) Appl. No.: 09/451,136

(22) Filed: Nov. 30, 1999

(51) Int. Cl.[7] .............................................. H01L 21/8242
(52) U.S. Cl. ............................................................. 438/253
(58) Field of Search .................................... 438/253, 239, 438/586, 396, 453, 296, 624, 640, 657, 397, 254–256

(56) References Cited

U.S. PATENT DOCUMENTS 5,670,404 * 9/1997 Dai ........................................ 438/239

* cited by examiner

Primary Examiner—Charles Bowers
Assistant Examiner—Craig Thompson
(74) Attorney, Agent, or Firm—Jiawei Huang; J.C. Patents

(57) ABSTRACT

A method of fabricating a dynamic random access memory is described. The surrounding of a capacitor is covered with stop layers to prevent damage during the etching process for forming a bit line contact opening. A first dielectric layer is formed and it is patterned to form a capacitor opening therein. A conformal first stop layer is formed and covers the first dielectric layer and the capacitor opening. A part of the conformal first stop layer on the first source/drain is removed to form a self-aligned node contact opening. The capacitor is formed in the capacitor opening and the self-aligned node contact opening. A conformal second stop layer layer are formed over the substrate. A part of the second dielectric layer over the second source/drain, the conformal second stop layer, the first stop layer and the first dielectric layer underneath is removed to form a self-aligned bit line contact opening. A bit line is formed over the third dielectric layer and within the self-aligned bit line contact opening.

19 Claims, 12 Drawing Sheets

METHOD OF FABRICATING DYNAMIC RANDOM ACCESS MEMORY

BACKGROUND OF THE INVENTION

1. Field of the Invention

The invention relates to a method of fabricating a semiconductor device. More particularly, the present invention relates to a method of fabricating a dynamic random access memory.

2. Description of the Related Art

In the process of fabricating dynamic random access memory, every dynamic random access memory cell includes a field effect transistor and a capacitor, and the process requires a the bit lines to connect to the source/drain of the field effect transistors and an interconnect. Therefore, the processes for fabricating DRAM is more complicated than the process for fabricating other semiconductor devices, and the factors to be considered are also more numerous in the process integration.

As highly integrated devices are required, the device size is scaled down to fulfill design requirements. In other words, the result of devices requiring high integration reduces the space available for capacitor formation. On the other hand, computer software is gradually becoming huge, and more memory capacity is required. In the case where it is necessary to have a smaller size with sufficient memory capacity, the conventional method of fabricating the DRAM capacitor has to change in order to fulfil the requirements of the trend.

It is thus necessary to find a method that increases the present surface area of the storage node of the capacitor to increase its capacitance, while still reducing the size of the capacitor. The stacked-type capacitor is one kind of DRAM structure for increasing capacitance. There are two main types of stacked-type capacitors, which are classified by the relative position of the bit lines and capacitors. The one is the bit line over capacitor type, while the other is capacitor over bit line type.

FIG. 1 is schematic, cross-sectional view illustrating the structure of a bit line over capacitor (BOC) DRAM fabricated according to the prior art method. Referring to FIG. 1, field effect transistors 102 are formed on a substrate 100, and then capacitors 116 are formed by the conventional process. The storage nodes 110 connecting to source/drain 106 of the field effect transistors 102 are first formed, and then the top plates 114 are formed during capacitor formation. Certainly, before the top plates 114 are formed, the processes for forming a capacitor include a step of forming a capacitor dielectric layer 112 between the storage node 110 and the top plates 114. The bit lines 118 are formed after the capacitors 116 are formed. The bit lines 118 are connected to another source/drain 108 of the field effect transistor 102 by bit line contacts 120.

FIG. 2 is schematic, cross-sectional view illustrating the structure of a capacitor over bit line (COB) DRAM fabricated according to the prior art method. Referring to FIG. 2, field effect transistors 202 are formed on a substrate 200, and then bit lines 204 are formed that connect to source/drain 206 of the field effect transistor 202. After the bit lines 204 are formed, capacitors 210 are formed, which are connected to another source/drain 208 by the storage nodes 212.

As high-density integration circuit is required, not only the device size but also the spaces between devices and devices are scaled down. The BOC and COB processes of conventional DRAM are complicated, and require repeated photolithography and etching steps. Therefore, the process capability is limited in lithography accuracy and etching capability.

The processes for forming the above-mentioned BOC-type DRAM as shown in FIG. 1 must have a high degree of lithography accuracy between the gates 104 (word lines) of the field effect transistors 102 and the storage nodes 110, between the bit line contacts 120 and the top plate 114 of the capacitor 116, or between the two storage nodes 110. If misalignment occurs during the process, the devices will suffer bridging.

Similarly, the processes for forming the COB-type DRAM as shown in FIG. 2 also gives rise to some problems as in the above-mentioned BOC-type DRAM. For example, the processes are subjected to the challenge of lithography accuracy between the gates 218 (word lines) and the bit line contacts 220 of the bit lines 204, between the gates 218 (word lines) and the storage node 212, or the two storage nodes 212. On the other hand, the capacitance of the storage node 212 depends on the effective contact areas between the storage node 212 and the capacitor dielectric layer 214. In the conventional process, the capacitance of a capacitor is increased by increasing the thickness of the storage nodes 212. However, after the device is integrated, the spaces of the two storage nodes 212 are reduced. The aspect ratio of the spaces between the two storage nodes 212 is increased as the thickness of the storage nodes 212 is increased. The storage nodes 212 are difficult to separate from each other during the patterning of etching process.

SUMMARY OF THE INVENTION

The present invention is a method of fabricating a dynamic random access memory. The surrounding of a capacitor is covered with stop layers to prevent damage in the etching process for forming a bit line contact opening. A first dielectric layer is formed and it is patterned to form a capacitor opening therein. A conformal first stop layer is formed and covers the first dielectric layer and the capacitor opening. A part of the conformal first stop layer on the first source/drain is removed to form a self-aligned node contact opening. The capacitor is formed in the capacitor opening and the self-aligned node contact opening. A conformal second stop layer layer are formed over the substrate. A part of the second dielectric layer over the second source/drain, the conformal second stop layer, the first stop layer and the first dielectric layer underneath is removed to form a self-aligned bit line contact opening. A bit line is formed over the third dielectric layer and within the self-aligned bit line contact opening.

The surrounding of the conducting layer and the capacitor are covered by the cap layer, spacers and stop layer. The cap layer, the spacers and the stop layer have etching rates that are different from the etch rates of the dielectric layer. Therefore, during the etching process for forming the node contact opening and the bit line contact opening, the cap layer, the spacer and the stop layer can protect the conducting gate and bottom plate, and prevent them from being damaged. The node contact opening and the bit line contact opening are formed in a self-aligned process. The problem of bridging between capacitors and word lines or between capacitors and bit lines can be avoided. The processes of the present invention are controlled easily, and the process window is increased.

The bottom plate of the capacitor is embedded in the capacitor opening and node contact opening. The conducting layer used for forming the bottom plates is polished by chemical mechanical polishing to form the bottom plates that are separated from each other, so that patterning of the bottom plate by photolithography and etching is not necessary in the present invention. Problems such as misalignment due to photolithography can be avoided. The difficulty in etching that comes from the conducting layer used for forming the bottom plate being too thick and the spaces of the bottom plate being too narrow can also be resolved. The processes of the present invention are simplified, so that the present invention is more cost effective and has a high yield potential. The layout rule for all capacitors-related layers can be significantly relaxed, so that the present invention makes high density array design and process control easy to attain.

Furthermore, the distance between the adjacent bottom plates can be controlled to be two times the thickness of the stop layer and the feature size.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A–3J are schematic, cross-sectional views illustrating a method of fabricating a DRAM according to a preferred embodiment of the method according to the present invention.

DESCRIPTION OF THE PREFERRED EMBODIMENTS

Figure 1:
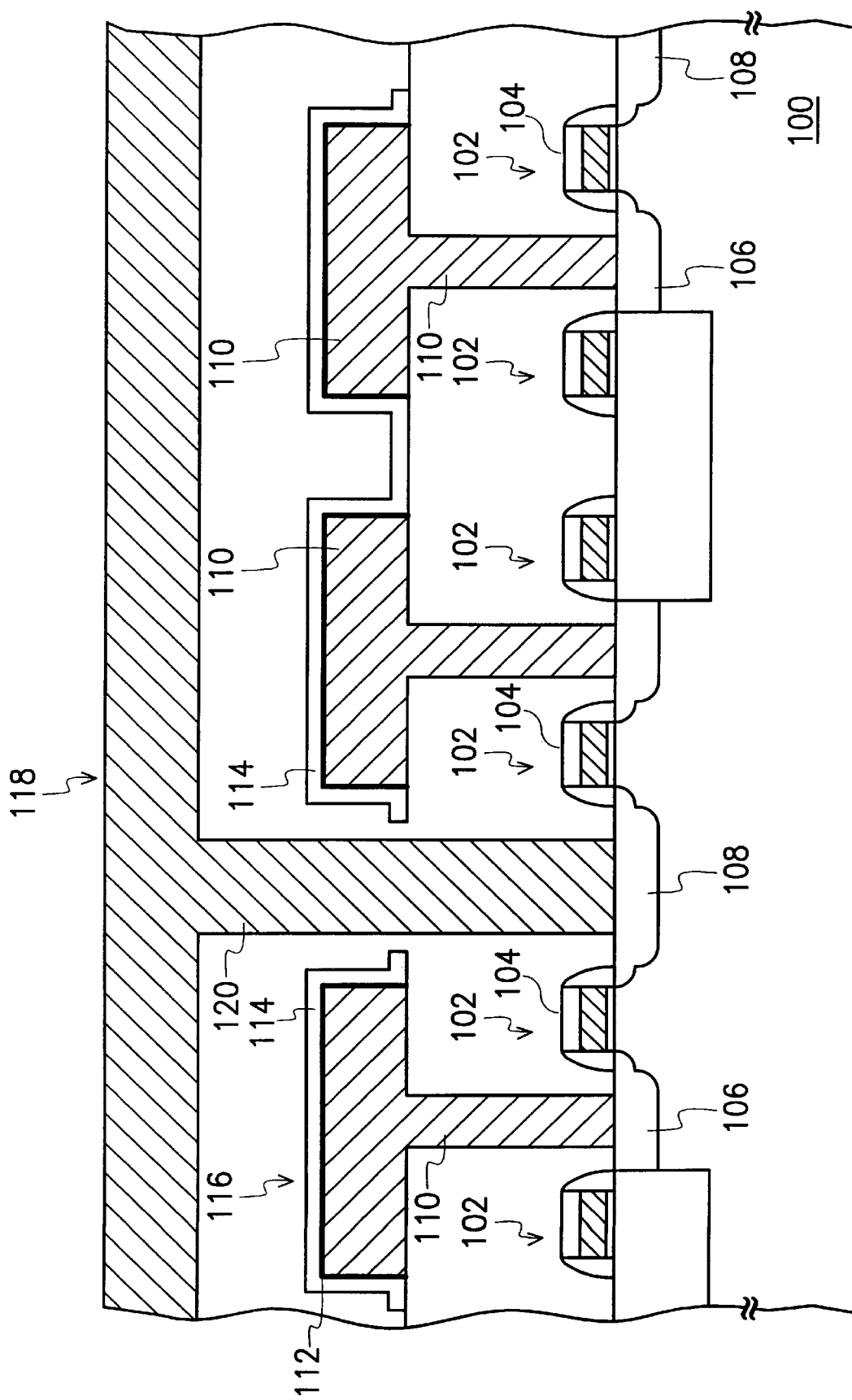
FIG. 1 is schematic, cross-sectional view illustrating the structure of a bit line over capacitor of DRAM fabricated according to the prior art method.
Figure 2:
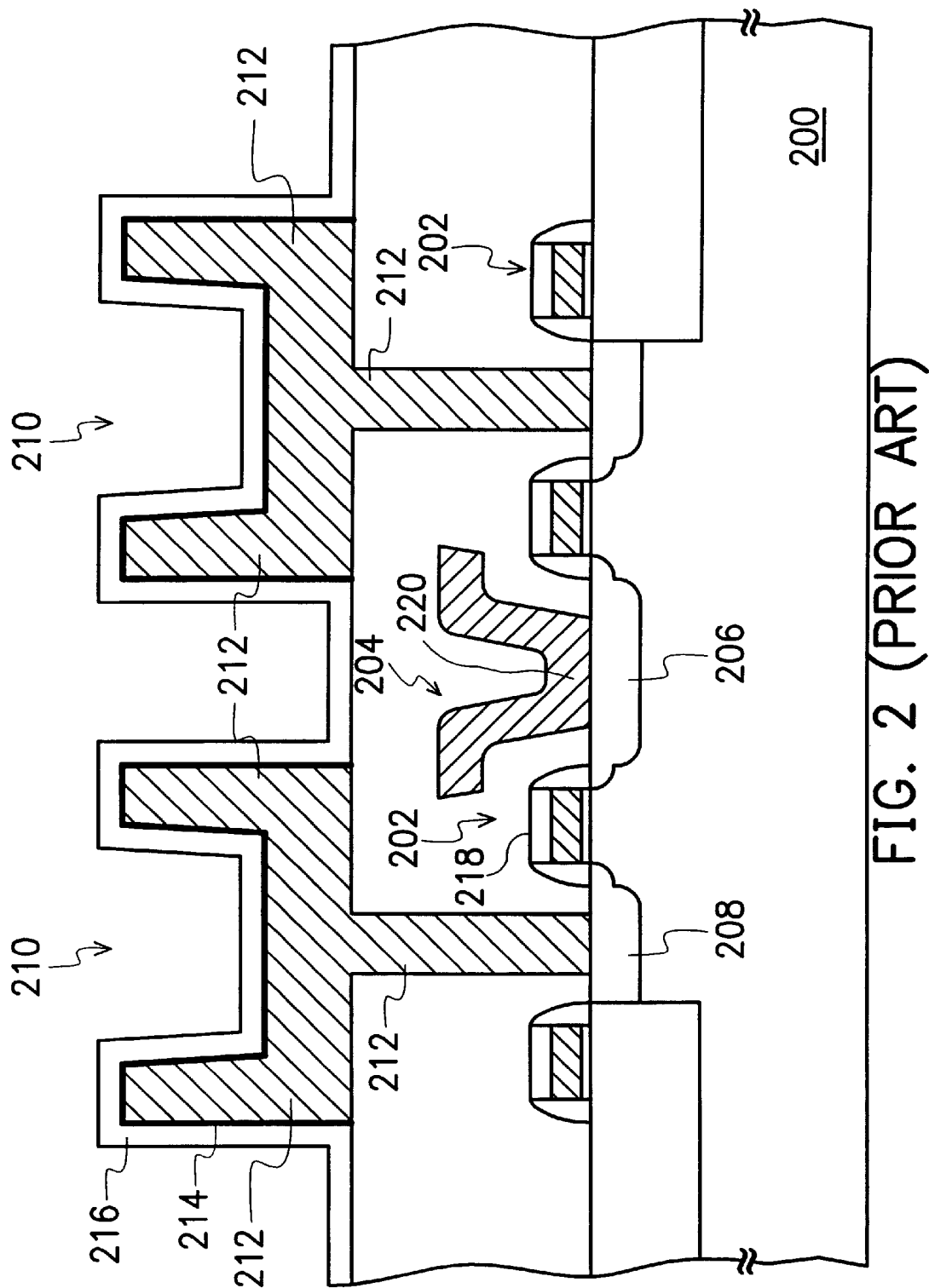
FIG. 2 is schematic, cross-sectional view illustrating the structure of a capacitor over of bit line DRAM fabricated according to a prior art method.
Figure 3A:
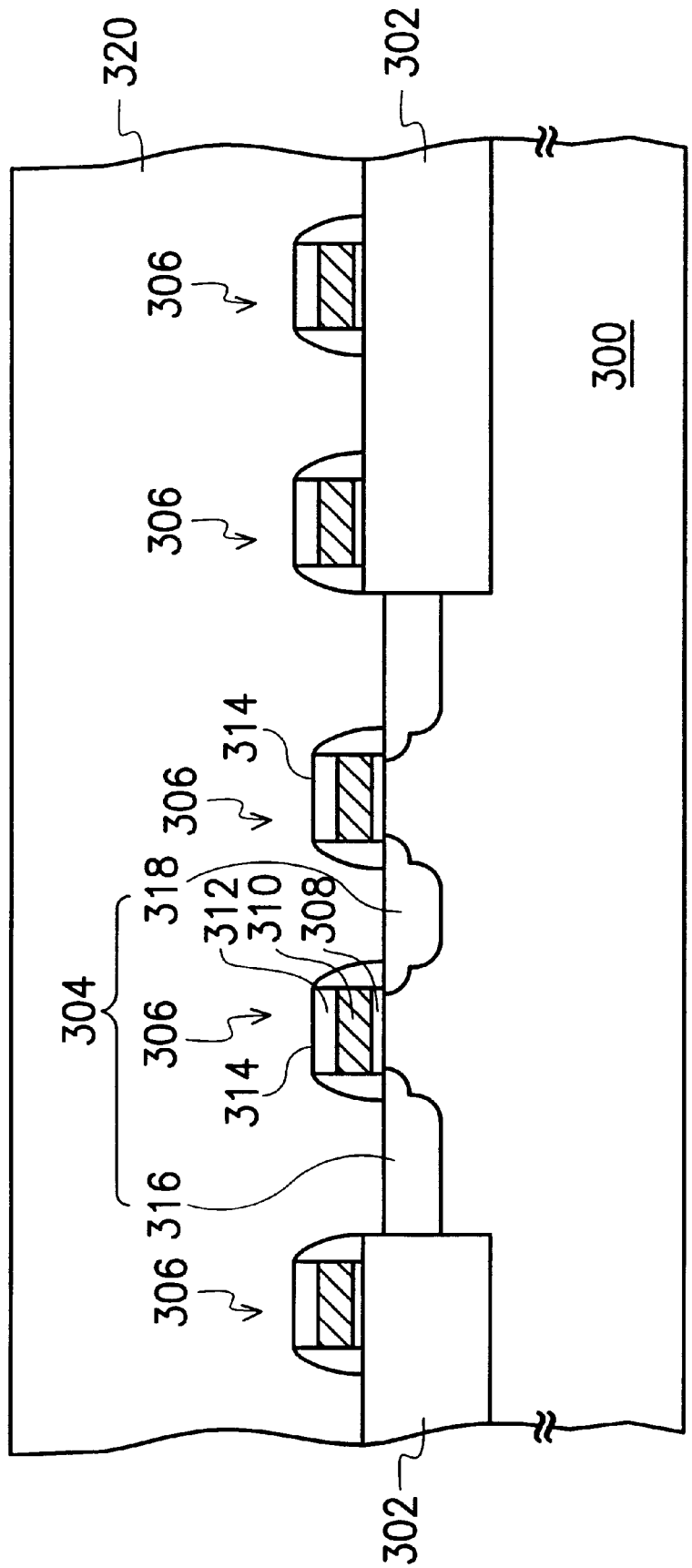

Referring to FIG. 3A, isolation structures 302 are formed in a substrate 300 to define the active regions of the substrate 300. The isolation structure 302 is formed by local oxidation (LOCOS) or shallow trench isolation. Field effect transistors 304 are formed on the substrate 300. Each field effect transistor 304 includes a gate 306 and source/drain 316, 318.

Each gate 306 comprises a gate oxide layer 308, a conducting gate layer 310, a cap layer 312 and spacers 314. The gate oxide layer 308 is formed by a thermal oxidation process to a thickness of about 40 Angstroms to about 140 Angstroms. A material of the conducting gate layer 310 includes doped polysilicon formed by, for example, chemical vapor deposition to a thickness of about 1000 Angstroms to about 2000 Angstroms. Another material of the conducting gate layer 310 comprises metal, or polycide, which is composed of a doped polysilicon layer and a silicide layer, both formed by chemical vapor deposition. The cap layers 312 comprise silicon nitride formed by, for example, chemical vapor deposition or low pressure chemical vapor deposition to a thickness of about 1500 Angstroms to about 2000 Angstroms. A material of the spacers 314 include silicon nitride which are formed by chemical vapor deposition to form silicon nitride layers over the substrate and then an etch back process is performed to form the spacers 314.

The source/drain 316, 318 are formed by ion implantion to implant dopants into the substrate 300 using the gates 306 and the isolation structure 302 as mask. The dopants comprise, for example, arsenic, phosphorous, or boron. Preferably, the source/drain 316, 318 comprise an extended source/drain under the spacers 314. The extended source/drain are formed by ion implantion to implant dopants into the substrate 300 before the spacers 314 are formed.

Referring to FIG. 3A, a dielectric layer 320 is formed over the substrate 300. A material suitable forming the dielectric layer 320 comprises, for example, silicon oxide, phosphosilicate glass (PSG) or borophosphosilicate glass (BPSG) formed by chemical vapor deposition (CVD), or spin-on-glass formed by spin coating. The dielectric layer 320 is planarized by, for example, a chemical mechanical polishing process in order to provide a smooth surface for subsequent processes.

Figure 3B:
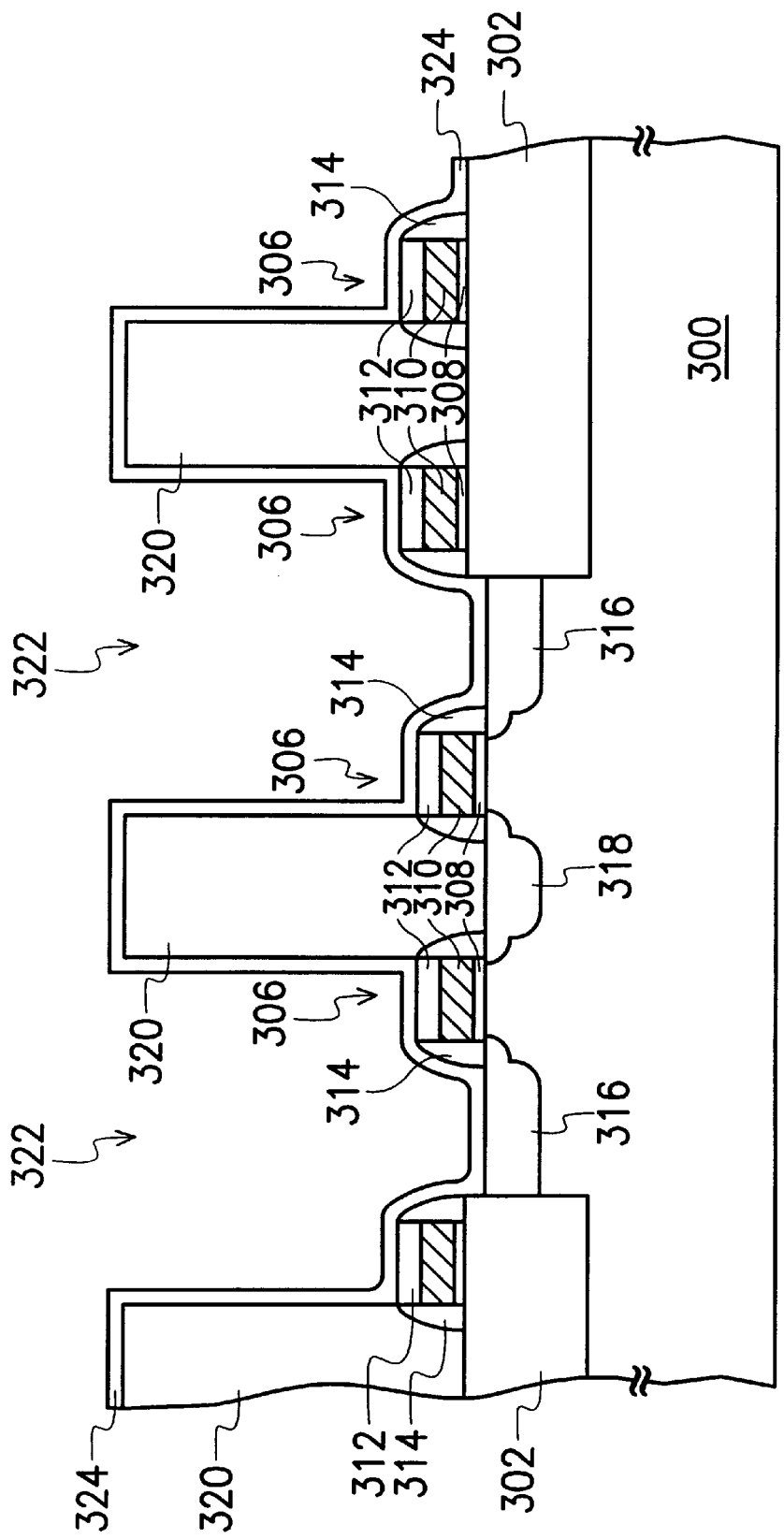

Referring to FIG. 3B, the dielectric layer 320 is patterned by photolithography and etching to forming capacitor openings 322, which exposes the cap layer 312, the spacers 314, and source/drain 316. The capacitor openings 322 are used to build the profile of the capacitors. The dielectric layer 320 is etched by, for example, a reactive ion etching process.

Thereafter, a conformal stop layer 324 is formed over the substrate 300, which conformal stop layer 324 covers the surface of the dielectric layer 320, the cap layer 312, the spacers 314 and the substrate 300. The stop layer 324 has an etching rate and a polishing rate that are different from those of the dielectric layer 320. A preferable material of the stop layer 324 comprises silicon nitride formed by, for example, chemical vapor deposition, low-pressure chemical vapor deposition and atmospheric pressure chemical vapor deposition to a thickness of about 300 Angstroms to about 500 Angstroms.

Figure 3C:
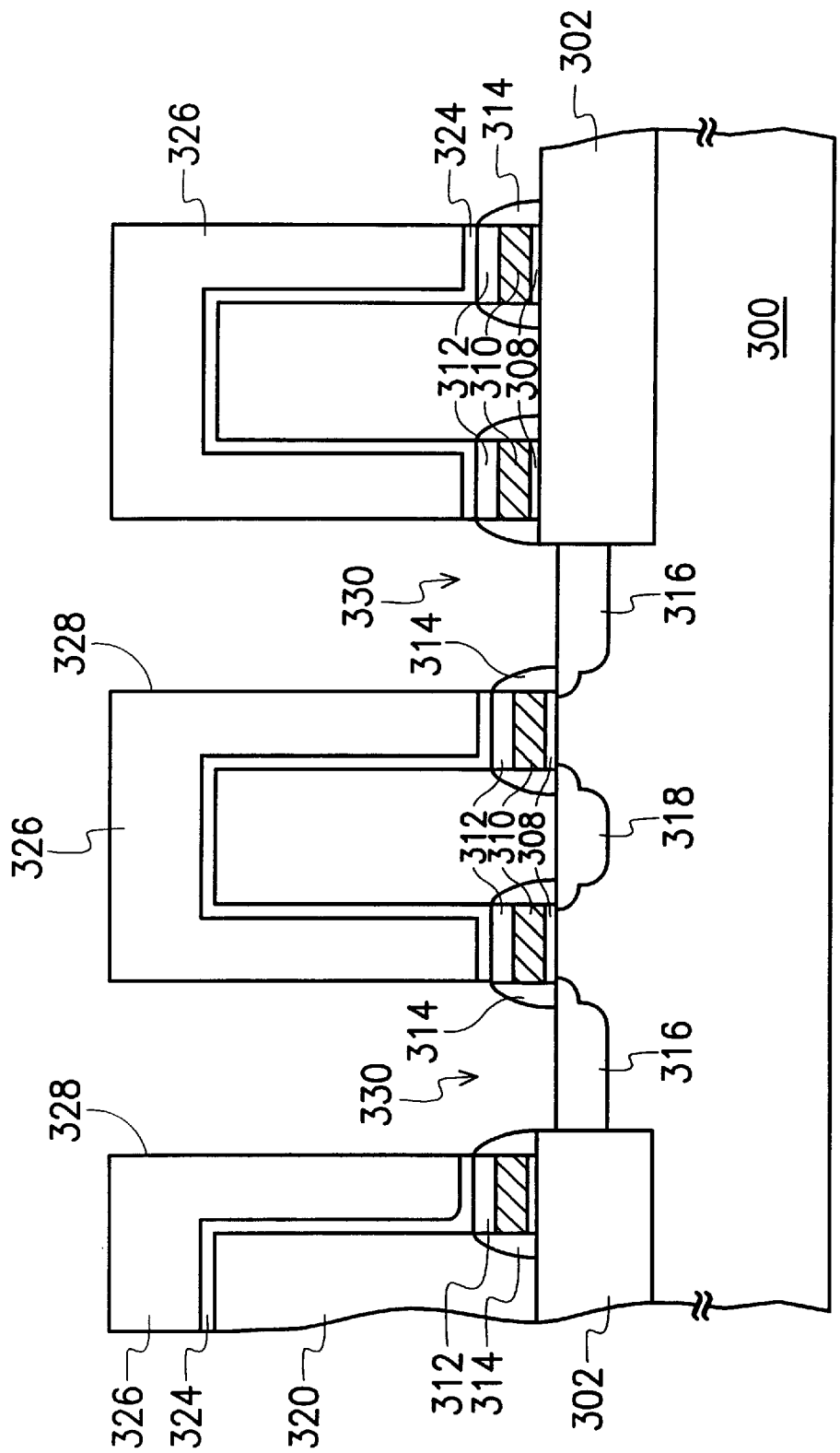

Referring to FIG. 3C, a mask layer 326 such as a photoresist layer is formed over the substrate 300. The mask layer 326 comprises an opening 328 exposing the conformal stop layer 324 over the source/drain 316. The conformal stop layer 324 exposed in the opening 328 is removed by, for example, a reactive ion etching process, so that a self-aligned contact opening 330 exposing the source/drain 316 is formed. The self-aligned contact opening 330 is used as a node contact opening.

Figure 3D:
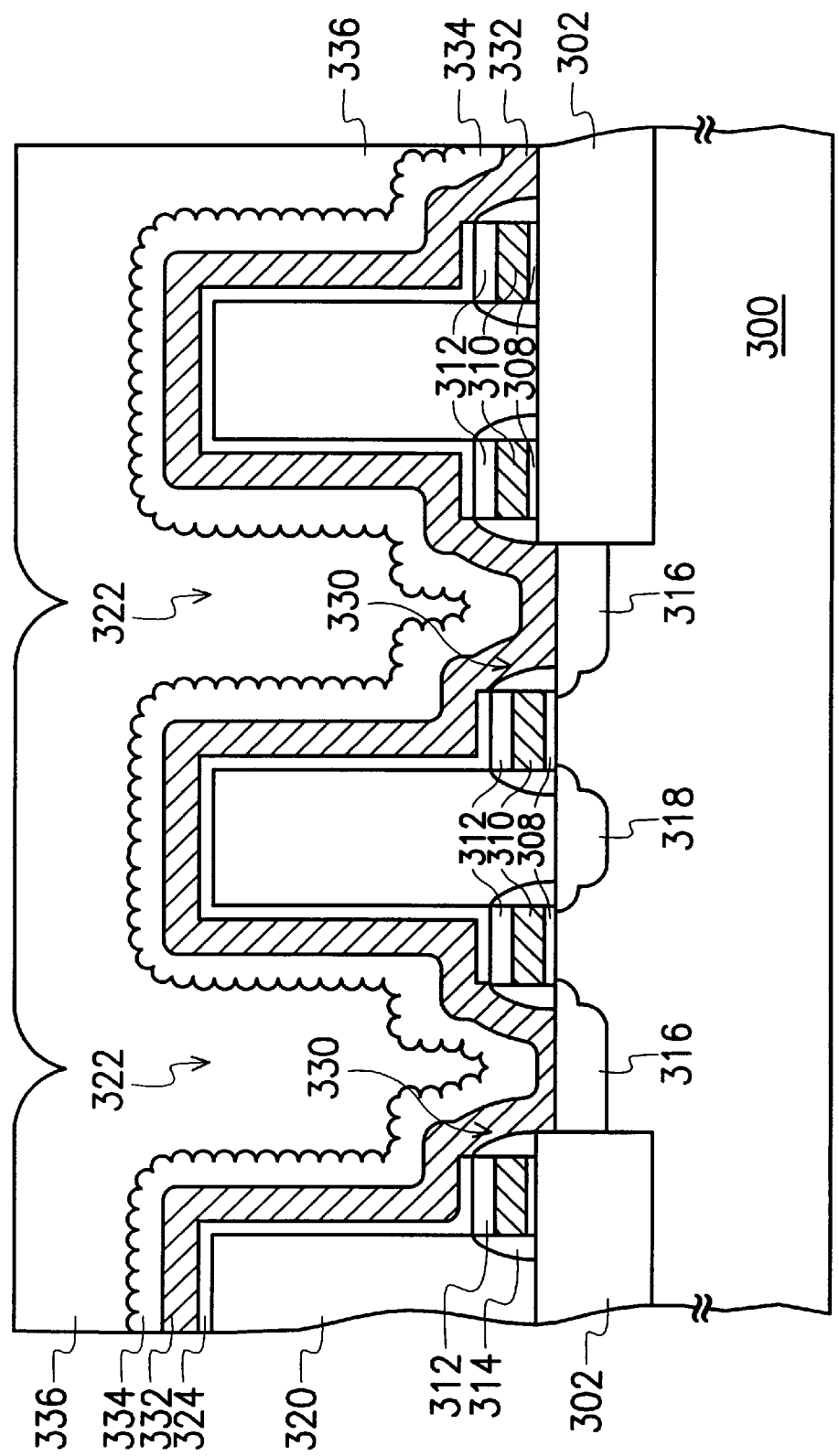

Referring to FIG. 3D, the mask layer 326 is removed, and then a conducting layer 332 is formed for use as the bottom plate. A material of the conducting layer 332 comprises doped polysilicon. Preferably, a hemispherical-grained silicon layer 334 is formed on the conducting layer 332 formed from doped polysilicon to increase the effective area of the bottom plate. The doped polysilicon layer is formed by, for example, chemical vapor deposition to a thickness of about 500 Angstroms to 1000 Angstroms, while the hemispherical-grained silicon layer 350 is formed by, for example, chemical vapor deposition to a thickness of about 500 Angstroms to 1000 Angstroms.

Referring to FIG. 3D, a dielectric layer 336 is formed to cover the hemispherical-grained silicon layer 334 and to fill the remained space of the capacitor opening 322 and the self-aligned contact opening (node contact opening) 330. The dielectric layer 336 has a polishing rate that is different from the polishing rate of the stop layer 324. A material of the dielectric layer 336 is, for example, silicon oxide formed by chemical vapor deposition or low-pressure chemical vapor deposition.

Figure 3E:
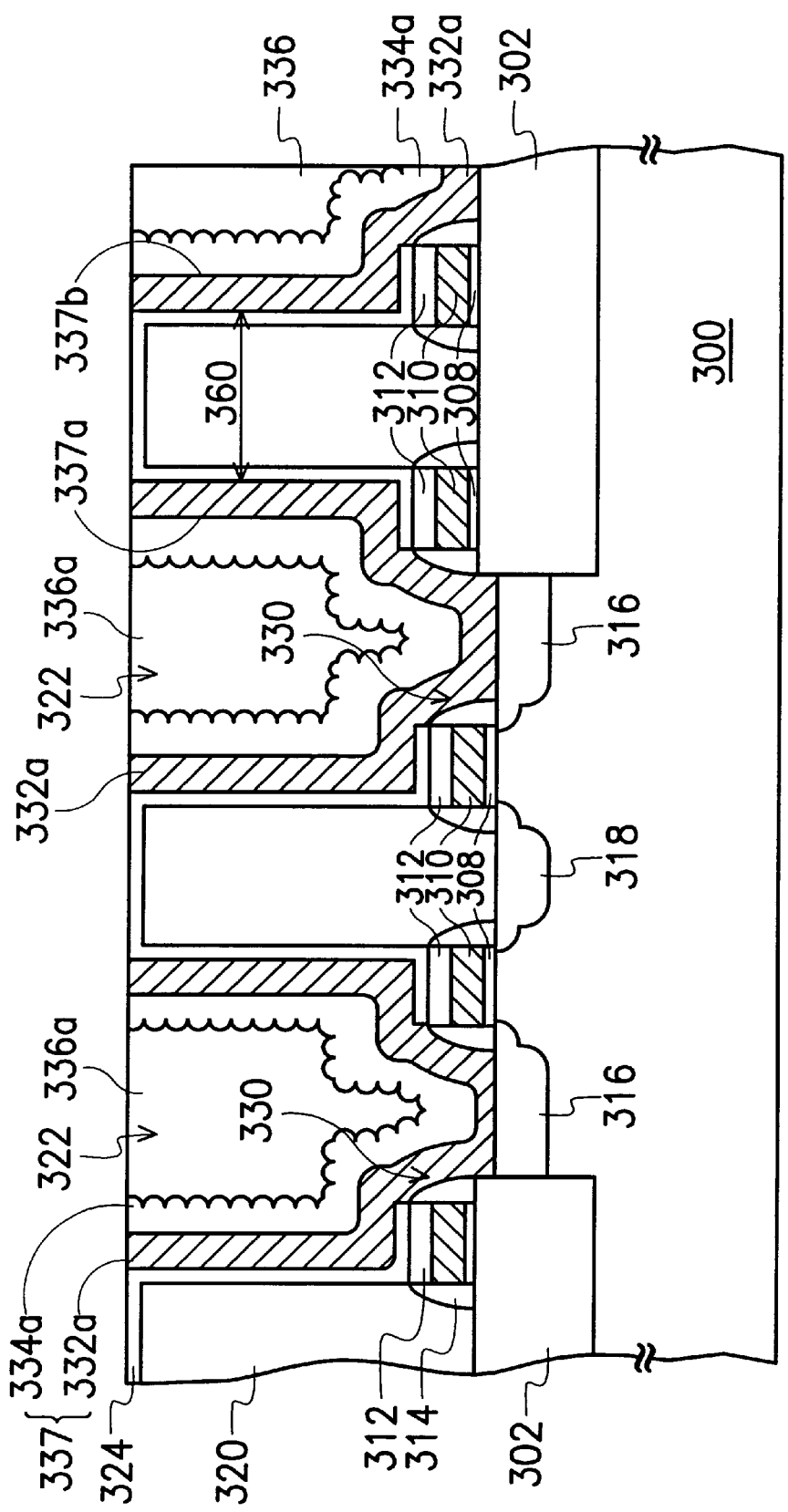

Referring to FIG. 3E, the conducting layer 332, the hemispherical-grained silicon layer 334 and the dielectric layer 336 over the surface of the stop layer 324 are removed, preferably by, for example, chemical mechanical polishing using the stop layer 324 as polishing stop layer. Therefore, the conducting layer 332a, the hemispherical-grained silicon layer 334a and the dielectric layer 336a are left in the capacitor opening 322 and the self-aligned contact opening (node contact opening) 330, wherein the remaining conducting layer 332a and the remaining hemispherical-grained silicon layer 334a are used for the bottom plate 337.

Figure 3F:
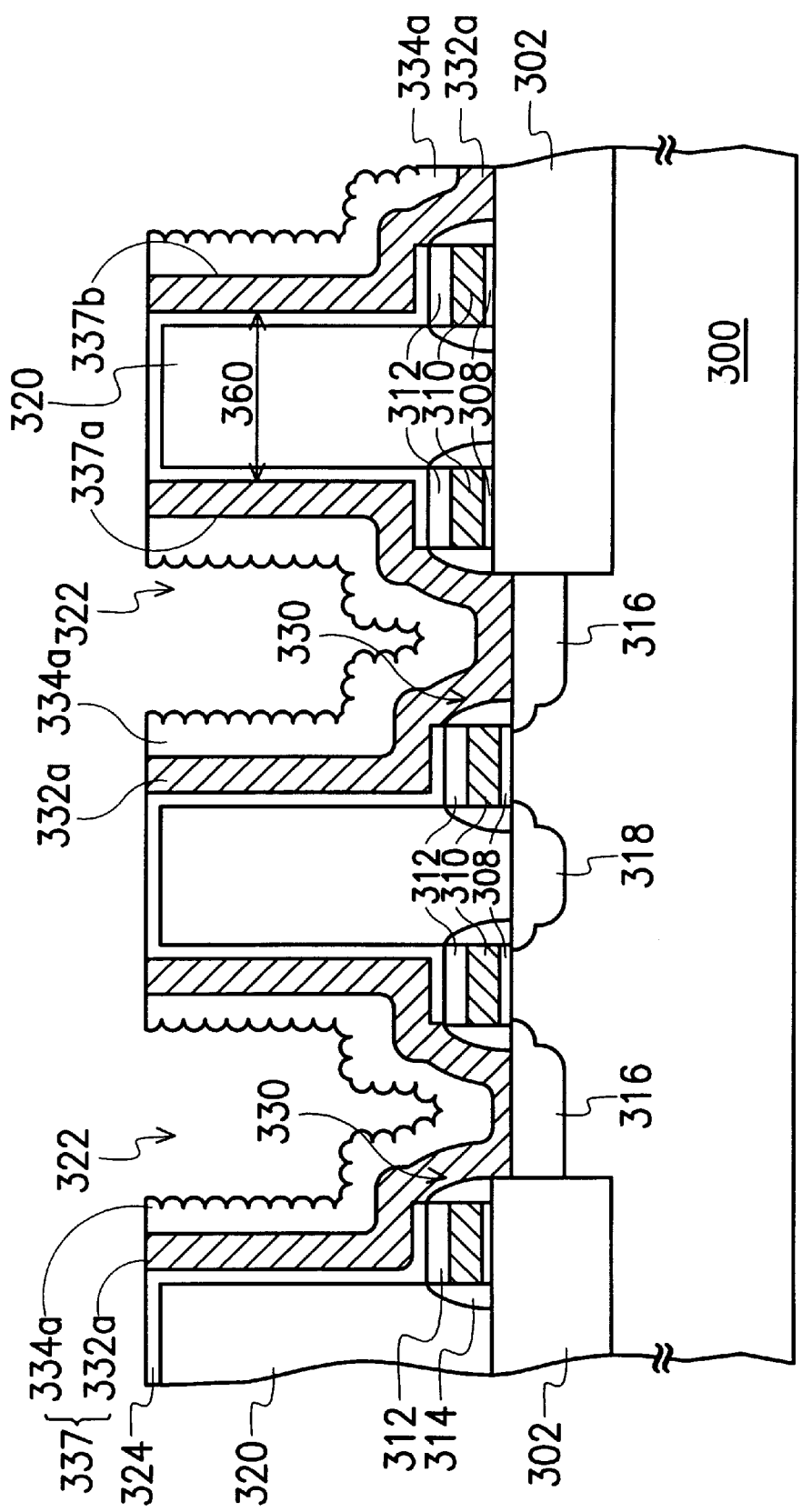

Referring to FIG. 3F, the remained dielectric layer 336a is removed by, for example, a wet etching process to expose the surface of the hemispherical-grained silicon layer 334a of the bottom plate 337. The wet etching process is performed by a buffer oxide etchant, a dilute hydrofluoric acid etchant, or like etchants. The stop layer 324 protects the dielectric layer 320 underneath to prevent it from suffering damage during the etch process.

In the present invention, after the hemispherical-grained silicon layer 334 is formed, the conducting layer 332 and the hemispherical-grained silicon layer 334 over the surface of the stop layer 334 are not removed by chemical mechanical polish to form the bottom plates, which are separated each other. Rather, the polishing process is performed after the capacitor opening 322 and self-aligned contact opening 330 are filled with dielectric layer 336. The conducting layer 332a and hemispherical-grained silicon layer 334a can be formed along with the dielectric layer 336a during the polishing process, so that the conducting layer 332 and the hemispherical-grained silicon layer 334 can avoid toppling.

The bottom plates 337 of the present invention are formed in the capacitor opening 322 and self-aligned contact opening 330. The bottom plates 337 are separated from each other by chemical mechanical polishing that replaces the conventional patterning method of photolithography and etching. Problems such as misalignment arising form photolithography can be avoided. The difficult etching problem that comes from the conducting layer used for forming the bottom plate being too thick and the spaces of the bottom plate expected too narrow is resolved.

In the present invention, the distance 360 between the bottom plate 337a and the bottom plate 337b that are adjacent over the isolation structure 302 can be controlled by the thickness of the stop layer 324 and the dimension of the patterned dielectric layer 320. The dimension of the dielectric layer 320 depends on the feature size. Therefore, the minimum dimension 360 is equal to two times the thickness of the stop layer 324 and the feature size. The distance between cells can be effetely reduced, so that the method of the present invention can be used to fabricate a high-density array memory device.

Figure 3G:
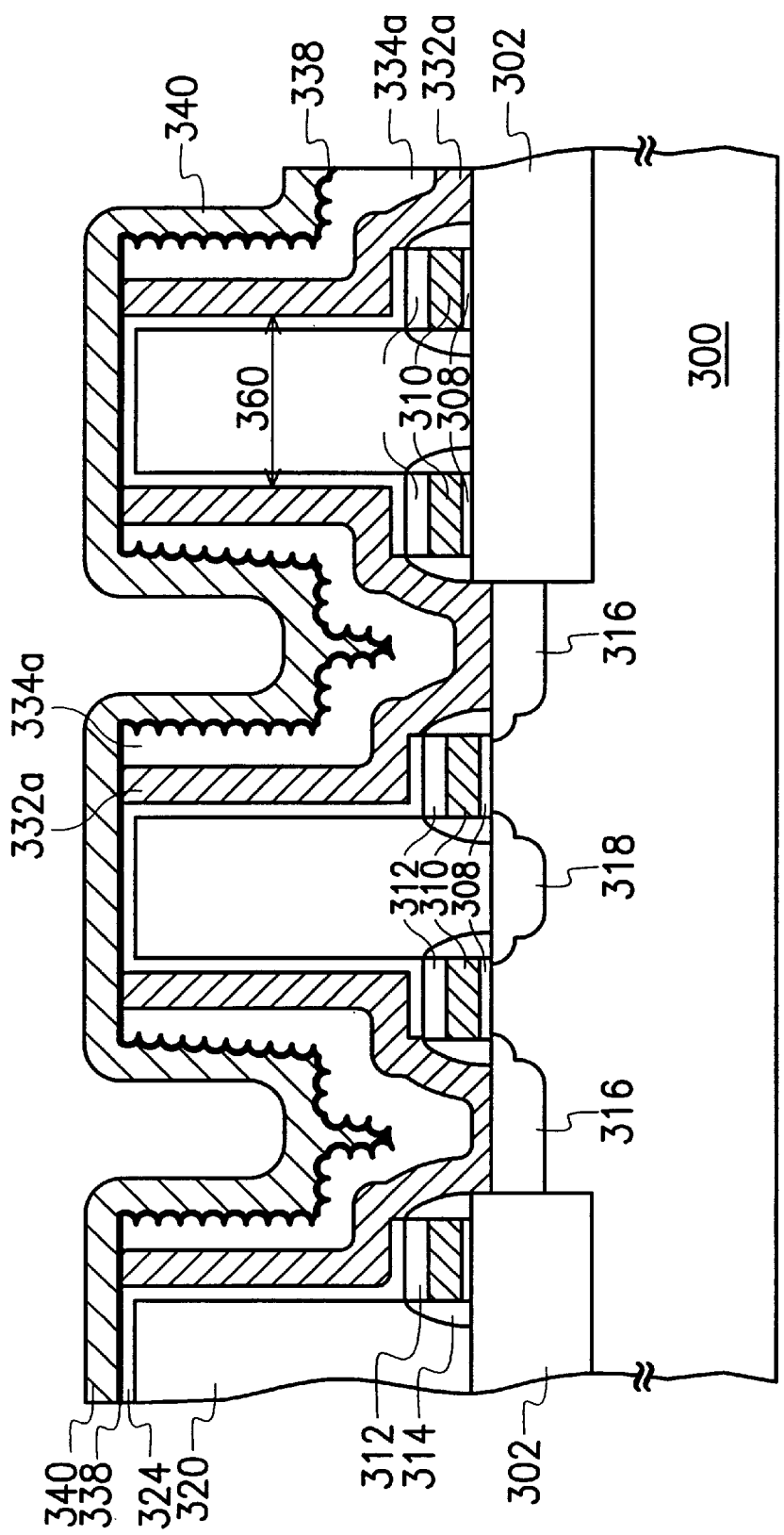

Referring to FIG. 3G, a capacitor dielectric layer 338 is formed over the substrate 300. A material of the capacitor dielectric layer 338 comprises, for example, oxide/nitride/oxide formed by low-pressure chemical vapor deposition. Preferably, a pre-cleaning process is performed by, for example, a buffer oxide etchant, a dilute hydrofluoric acid etchant, or like etchants before forming the capacitor dielectric layer 338. After the capacitor dielectric layer 338 is formed, a conducting layer 340 is formed thereon for use as the top plates of the capacitor. The conducting layer 340 comprises a doped polysilicon layer formed by chemical vapor deposition.

Figure 3H:
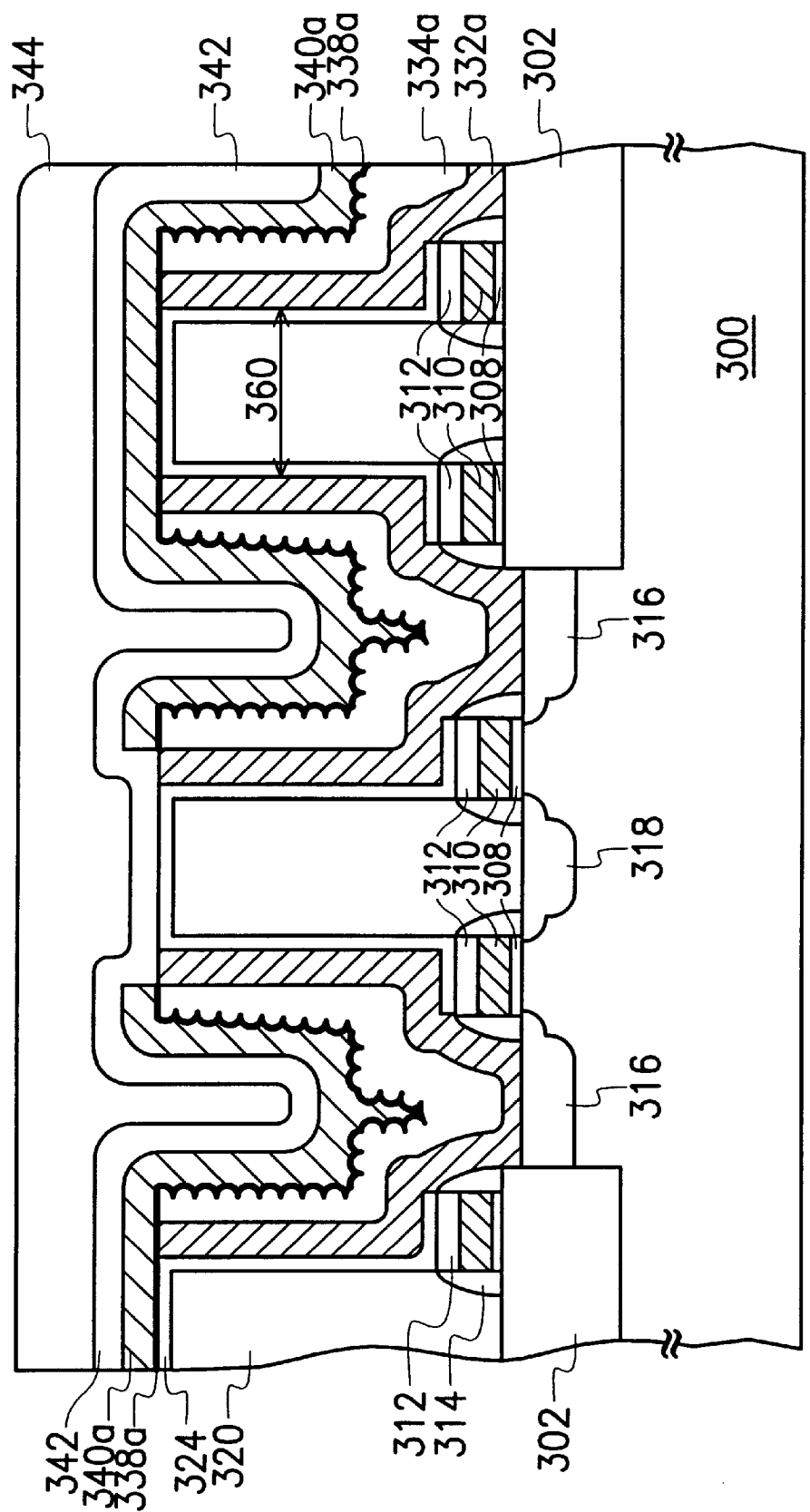
Figure 31:
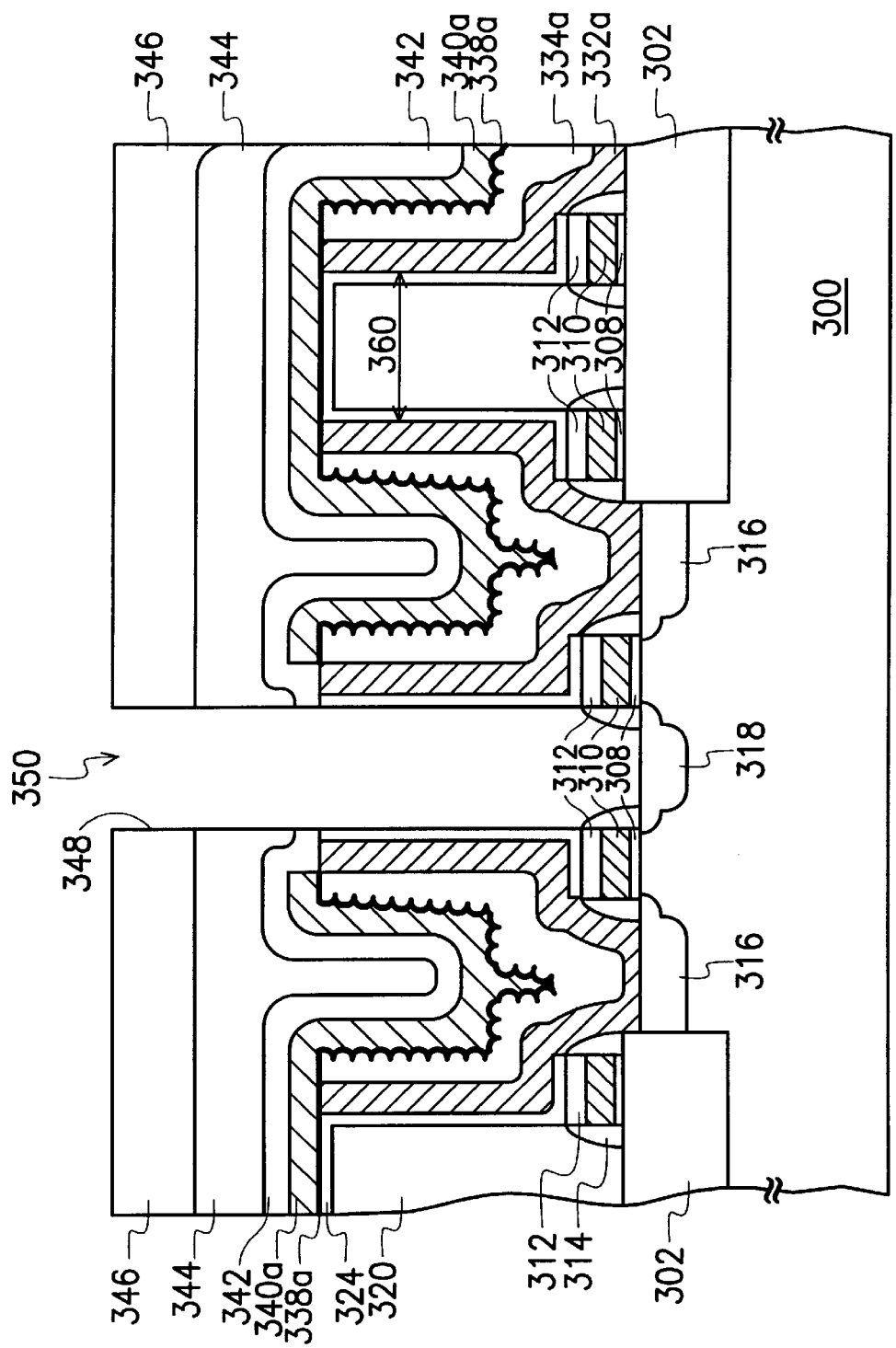

Referring to FIG. 3H, the conducting layer 340 and the capacitor dielectric layer 338 is patterned by photolithography and etching. Therefore, conducting layer 340a and the capacitor dielectric layers 338a are separated, and surface of stop layer 324 is exposed, wherein the conducting layers 340a are used as the top plates of the capacitor.

A conformal stop layer 342 and a dielectric layer 344 are formed over the substrate 300. The stop layer 342 has an etching rate and that is different from etching rates of the dielectric layer 344 and the dielectric layer 320. A preferred material of the stop layer 342 comprises silicon nitride formed by chemical vapor deposition or low-pressure chemical vapor deposition to a thickness of about 200 Angstroms to about 500 Angstroms. A material of the dielectric layer 344 comprises silicon oxide formed by, for example, chemical vapor deposition, low-pressure chemical vapor deposition or atmosphere chemical vapor deposition. Preferably, the dielectric layer 344 is planarized by, for example, a chemical mechanical polishing process in order to provide a smooth surface for subsequent processes.

Referring to FIG. 3I, a mask layer 346 such as photoresist is formed over the dielectric layer 344. The mask layer 346 has openings 348 which expose the dielectric layer 344 over the source/drain 318.

The dielectric layer 344 exposed in the openings 348, the stop layers 342, 324 and dielectric layer 320 underneath are removed to form bit line contact openings 350 exposing the source/drain 318. With the stop layer 342 serving as stop layer, a reactive ion etching process is performed to remove the dielectric layer 344 exposed in the openings 348. After changing the etching source for the reactive ion etching, the stop layers 342, 324 are removed using the dielectric layer 320 as stop layer. After the etching source is changed again, the dielectric layer 320 over the source/drain 318 is removed.

While forming the bit line contact openings 350, the stop layer 342 and 324 have etching rates that are different from the etching rate of the dielectric layers 344 and 320. The dielectric layer 320 has an etching rate that is different from the etching rates of the cap layer 312 and the spacers 314. Therefore, the bit line contact opening 350 can self-align the source/drain 318. In the other words, if misalignment occurs in the photolithography process, the bit line contact opening 350 also can be formed along the surface of the stop layer 342, the stop layer 324, the cap layer 312 and spacers 314. The stop layer 342, the stop layer 324, the cap layer 312 and spacers 314 can protect the conducting layer 310 and the bottom plates 337 to prevent damage. The processes of the present invention are more easily controlled than the processes of the prior art. The phenomenon of a bridge between bit lines and the conducting layers 310 can be avoided.

Figure 3J:
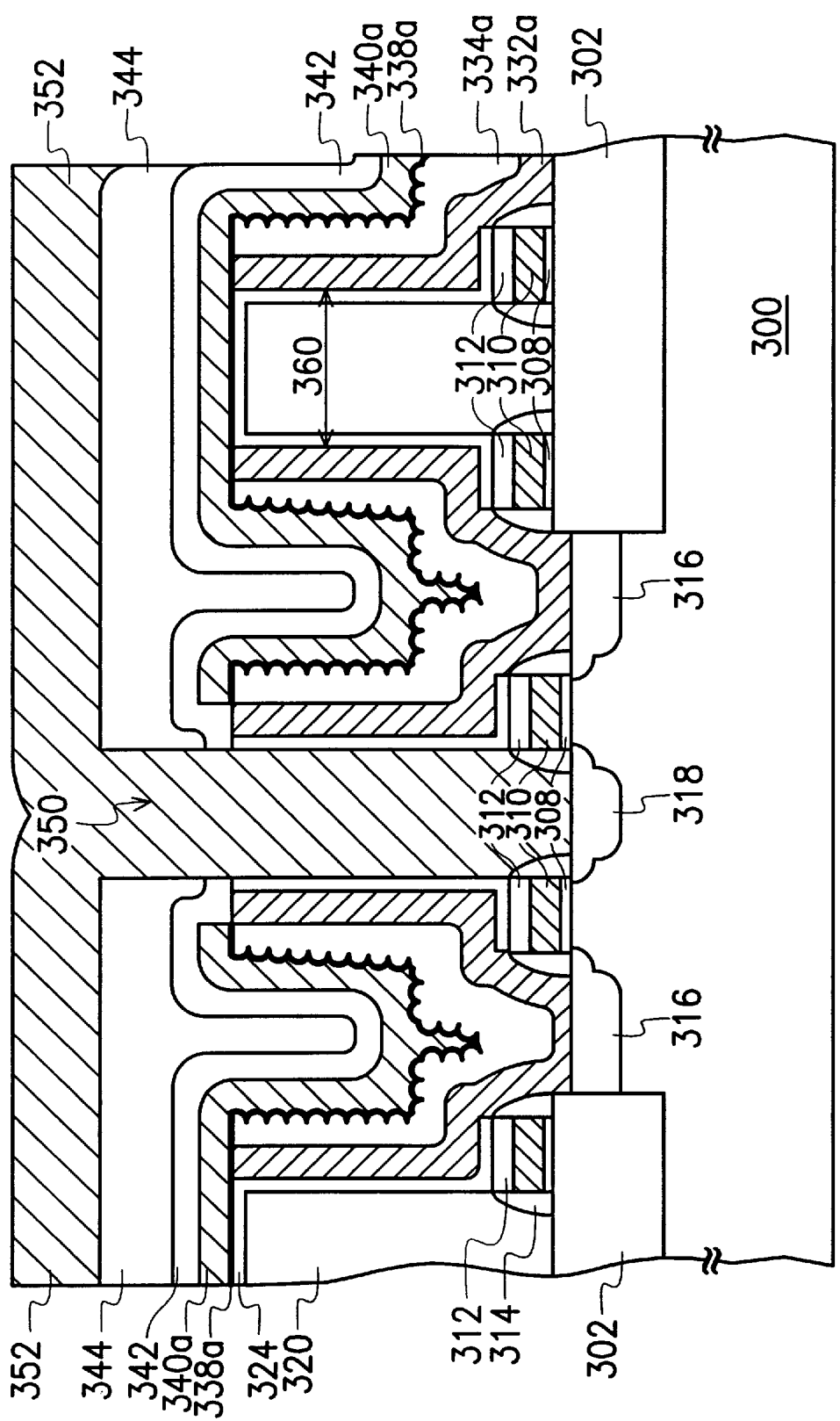

Referring to the FIG. 3J, the mask layer 346 is stripped, and then a conducting layer is formed in the bit line contact opening 350 and over the dielectric layer 346. The conducting layer is patterned by photolithography and etching to form bit lines 352 connecting to the source/drain 318. The conducting layer comprises a doped polysilicon layer or polycide, which is formed by chemical vapor deposition or sputtering.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a dynamic random access memory, comprising:
   providing a substrate;
   forming a gate on the substrate, the gate comprising a cap layer and a spacer;
   forming a first source/drain and a second source/drain in the substrate;
   forming a first dielectric layer over the substrate;

patterning the first dielectric layer to form a capacitor opening therein, which exposes the cap layer, the spacer and the first source/drain;

forming a conformal first stop layer covering the first dielectric layer and the capacitor opening;

removing a part of the conformal first stop layer on the first source/drain to form a self-aligned node contact opening;

forming a first conducting layer covering the capacitor opening, the self-aligned node contact opening and the conformal first stop layer;

forming a second dielectric layer covering the first conducting layer and filling the capacitor opening and the self-aligned node contact opening;

performing a chemical mechanical polishing process to remove the second dielectric layer and the first conducting layer that are formed over the first stop layer while using the first stop layer as a polish stop layer, so that remaining first conducting layer is used as a bottom plate of a capacitor;

removing the remained second dielectric layer;

forming a capacitor dielectric layer on the substrate;

forming a second conducting layer on the capacitor dielectric layer;

patterning the second conducting layer and the capacitor dielectric layer to expose a part of the first stop layer over the second source/drain, wherein the patterned second conducting layer is used as a top plate of the capacitor;

forming a conformal second stop layer over the substrate;

forming a third dielectric layer over the conformal second stop layer;

removing a part of the third dielectric layer over the second source/drain, the conformal second stop layer, the first stop layer and the first dielectric layer underneath to form a self-aligned bit line contact opening, which exposes the second source/drain;

forming a third conducting layer covering the third dielectric layer and filling the self-aligned bit line contact opening to connect to the second source/drain; and patterning the third conducting layer to form a bit line.

2. The method as claimed in claim 1, wherein an etching rate of the conformal first stop layer is different from etching rates of the first dielectric layer, the second dielectric layer, and the third dielectric layer.

3. The method as claimed in claim 1, wherein a polishing rate of the conformal first stop layer is different from polishing rates of the first dielectric layer and the second dielectric layer.

4. The method as claimed in claim 1, wherein an etching rate of the conformal second stop layer is different from etching rates of the first dielectric layer and the third dielectric layer.

5. The method as claimed in claim 1, wherein a material of the first conducting layer comprises doped polysilicon.

6. The method as claimed in claim 5, further comprising forming a hemispherical-grained silicon layer on the first conducting layer.

7. The method as claimed in claim 1, wherein the step of removing the part of the conformal first stop layer on the first source/drain to form the self-aligned node contact opening further comprises:

forming a first mask layer over the substrate, wherein the first layer has a first opening therein over the first source/drain, and the first opening is smaller than the capacitor opening;

etching the first stop layer exposed in the first opening, while using the first mask layer as a etch mask, to form the self-aligned node contact opening exposing the first source/drain; and removing the first mask layer.

8. The method as claimed in claim 7, wherein the first stop layer is etched by a reactive ion etching process.

9. The method as claimed in claim 1, wherein the step of removing the part of the third dielectric layer over the second source/drain, the conformal second stop layer, the first stop layer and the first dielectric layer underneath to form the self-aligned bit line contact opening further comprises:

forming a second mask layer over the substrate, wherein the second layer has a second opening therein over the second source/drain;

etching the second stop layer exposed in the second opening, a part of the conformal second stop layer, the conformal first stop layer and the first dielectric layer underneath, while using the first mask layer as a etch mask, to form the self-aligned bit line contact opening exposing the second source/drain; and removing the second mask layer.

10. The method as claimed in claim 1, wherein the remained second dielectric layer is removed by a wet etching process.

11. A method of fabricating a dynamic random access memory, comprising:

providing a substrate;

forming a gate on the substrate, the gate comprises a cap layer and a spacer;

forming a first source/drain and a second source/drain;

forming a first dielectric layer over the substrate;

patterning the first dielectric layer to form a capacitor opening therein, which exposes the cap layer, the spacer and the first source/drain;

forming a conformal first stop layer covering the first dielectric layer and the capacitor opening;

removing a part of the conformal first stop layer on the first source/drain to form a self-aligned node contact opening;

forming a capacitor connecting to the first source/drain in the capacitor opening and the self-aligned node contact opening;

forming a conformal second stop layer over the substrate;

forming a second dielectric layer over the conformal second stop layer;

removing a part of the second dielectric layer over the second source/drain, the conformal second stop layer, the first stop layer and the first dielectric layer underneath to form a self-aligned bit line contact opening, which exposes the second source/drain; and forming a bit line over the third dielectric layer and within the self-aligned bit line contact opening to connect to the second source/drain.

12. The method as claimed in claim 11, wherein an etching rate of the first stop layer is different from etching rates of the first dielectric layer.

13. The method as claimed in claim 11, wherein an etching rate of the conformal second stop layer is different from etching rates of the first dielectric layer and the second dielectric layer.

14. The method as claimed in claim 11, wherein the step of removing the part of the conformal first stop layer on the source/drain to form the self-aligned node contact opening further comprises:

forming a first mask layer over the substrate, wherein the first layer has a first opening therein over the first source/drain and the first opening is smaller than the capacitor opening;

etching the first stop layer to expose the first opening, while using the first mask layer as a etch mask, to form the self-aligned node contact opening exposing the first source/drain; and removing the first mask layer.

15. The method as claimed in claim 14, wherein the first stop layer is etched by a eactive ion etching process.

16. The method as claimed in claim 11, wherein the steps of forming the capacitor comprise:

forming a first conducting layer covering the capacitor opening, the self-aligned node contact opening and the conformal first stop layer;

forming a third dielectric layer covering the first conducting layer and filling the capacitor opening and the self-aligned node contact opening;

performing a chemical mechanical polish process to remove the third dielectric layer and the first conducting layer that are over the first stop layer, while using the first stop layer as a polish stop layer, so that a remaining first conducting layer is used as a bottom plate of the capacitor;

removing a remaining third dielectric layer;

forming a capacitor dielectric layer on the substrate;

forming a second conducting layer on the capacitor dielectric layer; and pattering the second conducting layer and the capacitor dielectric layer to expose a part of the first stop layer over the second source/drain, wherein the patterned second conducting layer is used as a top plate of the capacitor.

17. The method as claimed in claim 16, wherein a polishing rate of the conformal first stop layer is different from a polishing rate of the third dielectric layer.

18. The method as claimed in claim 16, wherein the remaining third dielectric layer is removed by a wet etching process.

19. The method as claimed in claim 16, wherein the steps for forming the bit line comprise:

forming a third conducting layer covering the second dielectric layer and filling the self-aligned bit line contact opening to connect to the second source/drain; and patterning the third conducting layer to form a bit line.

* * * * *